United States Patent
Lin

(10) Patent No.: US 8,258,555 B2
(45) Date of Patent: Sep. 4, 2012

(54) SEMICONDUCTOR DEVICE HAVING EXTRA CAPACITOR STRUCTURE

(75) Inventor: Wei-Chieh Lin, Hsinchu (TW)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 10 days.

(21) Appl. No.: 13/008,908

(22) Filed: Jan. 19, 2011

(65) Prior Publication Data
US 2012/0049263 A1  Mar. 1, 2012

(30) Foreign Application Priority Data
Aug. 20, 2010 (TW) .............................. 99129067 A

(51) Int. Cl.
*H01L 29/76* (2006.01)
(52) U.S. Cl. ........ 257/288; 257/298; 257/330; 257/329; 257/341; 257/E29.265
(58) Field of Classification Search ................. 257/288, 257/298, 329, 330, 341
See application file for complete search history.

(56) References Cited

U.S. PATENT DOCUMENTS

| | | | |
|---|---|---|---|
| 7,375,029 B2 | 5/2008 | Poelzl | |
| 2002/0024091 A1* | 2/2002 | Mo | 257/330 |
| 2010/0148246 A1* | 6/2010 | Bhalla et al. | 257/329 |
| 2010/0155837 A1* | 6/2010 | Hebert | 257/334 |

* cited by examiner

*Primary Examiner* — Wai Sing Louie
(74) *Attorney, Agent, or Firm* — Winston Hsu; Scott Margo

(57) ABSTRACT

A semiconductor device includes a semiconductor substrate having a conductive type, a source metal layer, a gate metal layer, at least one transistor device, a heavily doped region having the conductive type, a capacitor dielectric layer, a conductive layer. The source metal layer and the gate metal layer are disposed on the semiconductor substrate. The transistor device is disposed in the semiconductor substrate under the source metal layer. The heavily doped region, the capacitor dielectric layer and the conductive layer constitute a capacitor structure, disposed under the gate metal layer, and the capacitor structure is electrically connected between a source and a drain of the transistor device.

11 Claims, 9 Drawing Sheets

SEMICONDUCTOR DEVICE HAVING EXTRA CAPACITOR STRUCTURE

BACKGROUND OF THE INVENTION

1. Field of the Invention

The present invention relates to a semiconductor device and a manufacturing method thereof, and more particularly, to a semiconductor device having an extra capacitor structure and a manufacturing method thereof.

2. Description of the Prior Art

Power semiconductor devices are mainly applied to power management devices, such as switching power supplies, power management integrated circuits for computers or computer accessories, backlight power supplies and motor control devices, etc., and can be sorted as metal-oxide-semiconductor thin film transistor (MOSFET) devices and insulated gate bipolar transistor (IGBT) devices, etc. In general, the power semiconductor devices are designed with trenches to lower power consumptions.

However, electronic products are developed toward lighter, thinner, shorter, and smaller designs, so that sizes and gaps of the trench MOSFET devices are continuously scaled down to have high integration and high density. In regard to trench NMOSFET device, when a width of each trench and a distance between the adjacent trenches are reduced, a coupling area between a gate conductive layer and an N-epitaxial layer respectively serving as a gate electrode and a drain electrode of the trench NMOSFET device is also reduced, and a contact area between a P-doped body region and an N-epitaxial layer is reduced as well. Accordingly, a capacitor between a gate and a drain of the trench NMOSFET device and a capacitor between a source and the drain of the trench NMOSFET device are reduced. As a result, an output capacitance of the NMOSFET device composed of the capacitor between the gate and the drain and the capacitor between the source and the drain is reduced, in which the capacitance between the source and the drain is much larger than the capacitance between the gate and the drain.

The trench NMOSFET device can be applied to a converter of a power management circuit, such as a switching device in a synchronous buck converter, and thus is switched on/off frequently. When the trench NMOSFET device is switched off, an output capacitor of the trench NMOSFET device is charged to have a voltage equal to a voltage of an external transformer. However, the converter further includes an inductor device, so that the output capacitor and the inductor device constitute an LC resonant circuit when the trench NMOSFET device is switched off, and a voltage spike is accordingly generated. Moreover, the output capacitance of the trench NMOSFET device is reduced with the decrease of the whole size of the device as well as the widths of the trenches. Accordingly, the voltage spike is increased when the trench NMOSFET device is switched off so as to generate higher power loss.

To prevent the voltage spike from being increased, a snubber circuit is generally utilized to electrically connect a source electrode and a drain electrode of a trench NMOSFET device 10 in parallel, and the snubber circuit is composed of a capacitor and a resistor electrically connected to each other in series. Please refer to FIG. 1, which schematically illustrates a circuit of reducing the voltage spike according the prior art. As shown in FIG. 1, a snubber circuit 12 is electrically connected between the source electrode S and the drain electrode D of a trench NMOSFET device 10 in parallel, and the snubber circuit 12 is composed of a capacitor C and a resistor R electrically connected to each other in series. Accordingly, a capacitor disposed outside the trench NMOSFET device 10 can be used to increase an output capacitance of the trench NMOSFET device 10 so as to reduce the voltage spike. However, an extra circuit device increases not only extra circuit costs but also extra fabrication costs due to extra welding process of.

As a result, it is still needed for a novel method of manufacturing a power semiconductor device to solve the aforementioned problem of the voltage spike in a simple and economic way.

SUMMARY OF THE INVENTION

It is therefore one of the objectives of the present invention to provide a semiconductor device having an extra capacitor structure and a manufacturing method thereof to solve the aforementioned problem of the voltage spike.

In accordance with the present invention, a provided semiconductor device having an extra capacitor structure includes a semiconductor substrate, a source metal layer, a gate metal layer, a drain metal layer, at least a transistor device, a heavily doped region, a capacitor dielectric layer, a conductive layer and an interlayer dielectric layer. The semiconductor substrate has an upper surface and a lower surface, and the semiconductor substrate has a first conductive type. The source metal layer is disposed on the upper surface of the semiconductor substrate, and the gate metal layer is disposed on the upper surface of the semiconductor substrate. The drain metal layer is disposed on the lower surface of the semiconductor substrate. The transistor device is disposed in the semiconductor substrate and between the source metal and the drain metal layer, and the transistor device includes a source electrode, a gate electrode, and a drain electrode. The source electrode is electrically connected to the source metal layer, the gate electrode is electrically connected to the gate metal layer, and the drain electrode is electrically connected to the drain metal layer. The heavily doped region is disposed in the semiconductor substrate and between the gate metal layer and the drain metal layer, and the heavily doped region has the first conductive type. The capacitor dielectric layer is disposed on the semiconductor substrate and in contact with the heavily doped region. The conductive layer is disposed between the capacitor dielectric layer and the gate metal layer and electrically connected to the source metal layer. The heavily doped region, the capacitor dielectric layer, and the conductive layer constitute a capacitor structure. The interlayer dielectric layer is disposed between the source metal layer and the semiconductor substrate and between the gate metal layer and the conductive layer.

In accordance with the present invention, a provided manufacturing method of the semiconductor device having an extra capacitor structure is described as followed. First, a semiconductor substrate having a first pad region and a second pad region defined thereon is provided, and the semiconductor substrate has an upper surface and a lower surface, and also the semiconductor has a first conductive type, additionally, the upper surface of the semiconductor substrate in the first pad region has at least a trench. Then, at least a transistor device is formed in the semiconductor substrate in the first pad region, and also a heavily doped region is formed in the semiconductor substrate in the second pad region, and the heavily doped region has the first conductive type. And then, a capacitor dielectric layer is formed on the semiconductor substrate. Next, a conductive layer is formed on the capacitor dielectric layer in the second pad region, and the heavily doped region, the capacitor dielectric layer, and the conductive layer constitute a capacitor structure in the second pad region. After that, an interlayer dielectric layer is formed on the conductive layer and the capacitor dielectric layer. Next, a source metal layer is formed on the interlayer dielectric layer in the first pad region, and a gate metal layer is formed on the interlayer dielectric layer in the second pad region, in which the source metal layer and the gate metal layer are electrically connected to a source electrode and a gate electrode of the transistor device respectively. Finally, a drain metal layer is formed under the lower surface of the semiconductor substrate, and the drain metal layer is electrically connected to a drain electrode of the transistor device.

In accordance with the present invention, the transistor device and the extra capacitor structure are fabricated in the same semiconductor device and electrically connected to the same drain metal layer and the source metal layer. Thus, an output capacitance of the semiconductor device can be raised. Accordingly, the voltage spike can be reduced, and the power loss can be lowered when the semiconductor device is switched off. Moreover, the extra capacitor structure composed of the N-heavily doped region, the capacitor dielectric layer, and the conductive layer is disposed under the gate metal layer, and the extra capacitor structure would not occupy a disposition space for the transistor device under the source metal layer so that the size of the transistor device can be prevented from being limited due to the extra capacitor structure being disposed under the source metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
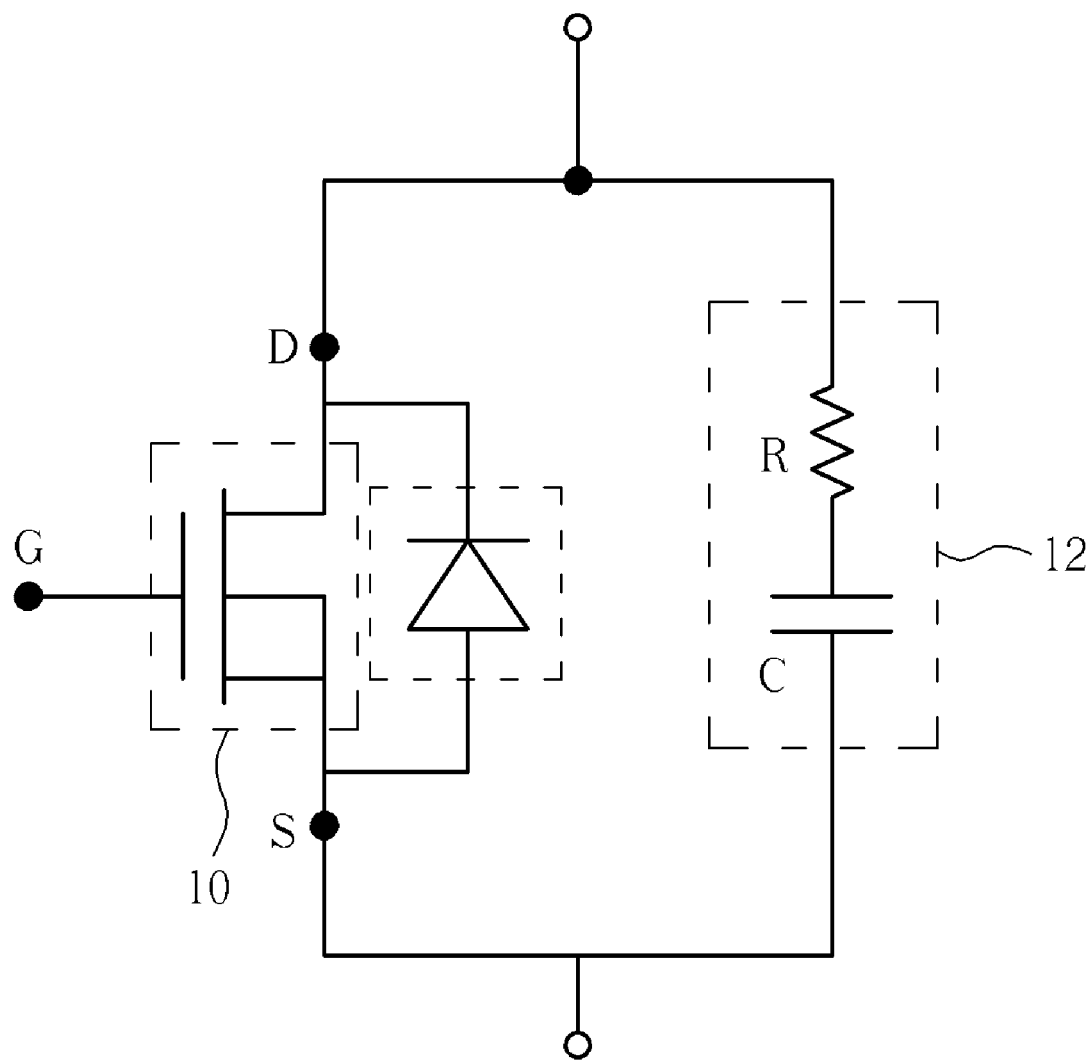
FIG. 1 is a schematic diagram illustrating a circuit of reducing the voltage spike according the prior art.
Figure 2:
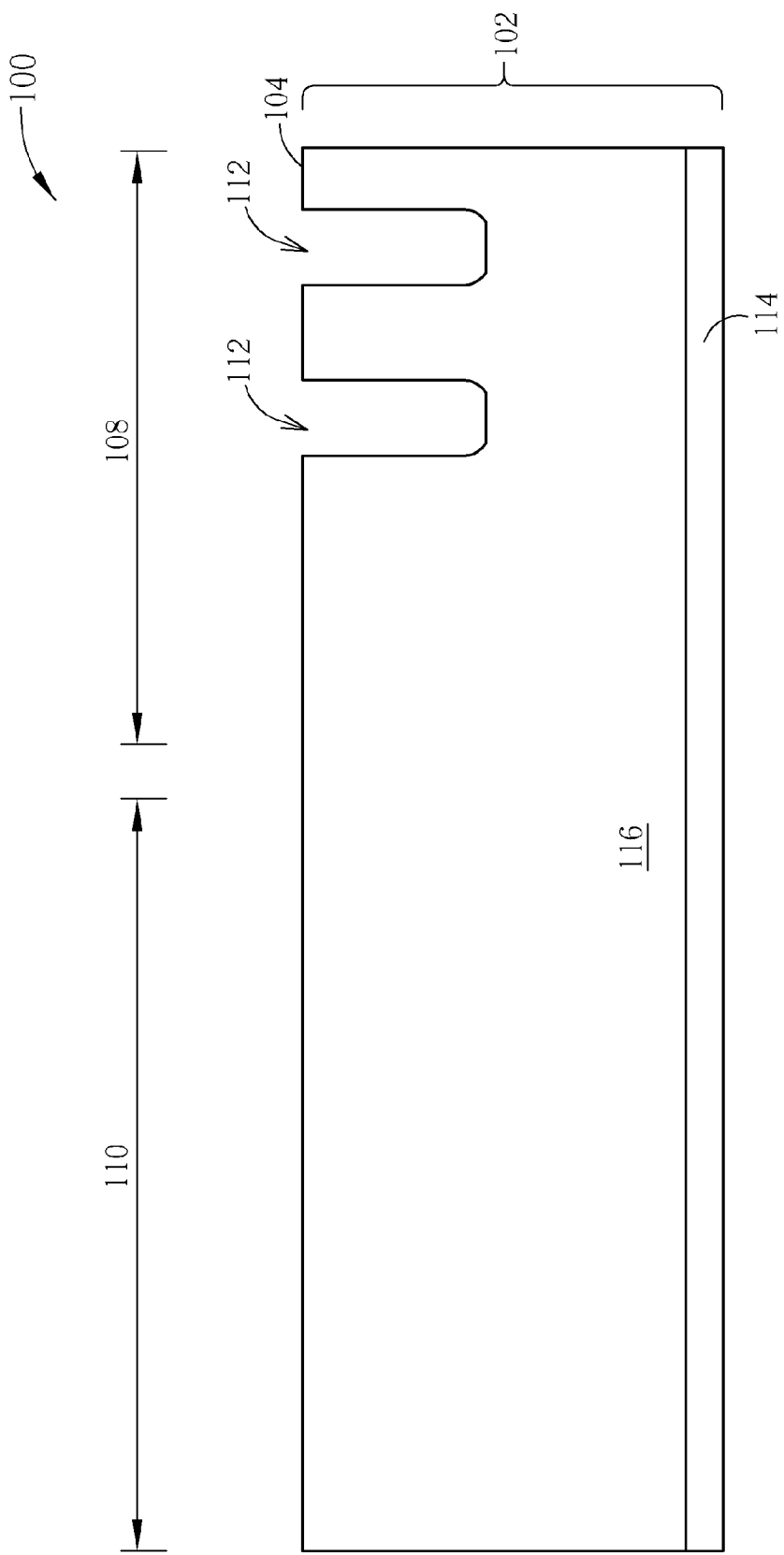
FIG. 2 through FIG. 7 are schematic diagrams illustrating a manufacturing method of a semiconductor device having an extra capacitor structure according to a first embodiment of the present invention.

Please refer to FIG. 2 through FIG. 7, which schematically illustrate a manufacturing method of a semiconductor device having an extra capacitor structure according to a first embodiment of the present invention. As shown in FIG. 2, a semiconductor substrate 102 is provided at first, and the semiconductor substrate 102 has an upper surface 104 and a lower surface 106. Additionally, the semiconductor substrate 102 has a first pad region 108 and a second pad region 110, and the upper surface 104 of the semiconductor substrate 104 in the first pad region 108 has at least one trench 112. In this embodiment, the first pad region 108 is defined as a region for disposing a source pad, and the second pad region 110 is defined as a region for disposing a gate pad, but not limited thereto. The semiconductor substrate 102 has a first conductive type, and the first conductive type is N type for example, but not limited thereto. Specifically, the step of providing the N-semiconductor substrate 102 is detailed in following descriptions. In the beginning, an N-substrate 114 is provided, and then an N-epitaxial layer 116 is formed on the N-substrate 114. Next, a photolithography and etching process is performed to form trenches 112 on the N-epitaxial layer 116 in the first pad region 108 by. The N-substrate 114 can include a material such as silicon substrate, and a doping dosage of the N-substrate 114 is higher than a doping dosage of the N-epitaxial layer 116. Since a voltage endurance of the semiconductor device increases with increase of a thickness and decrease of the doping dosage of the N-epitaxial layer 116, the thickness of the N-epitaxial layer 116 can be adjusted according to a requirement of the voltage endurance. Also, a number of the trenches 112 can be correspondingly adjusted according to a number of the required transistor devices. In this embodiment, the number of the trenches 112 being two is taken as an example, but not limited thereto.

Figure 3:
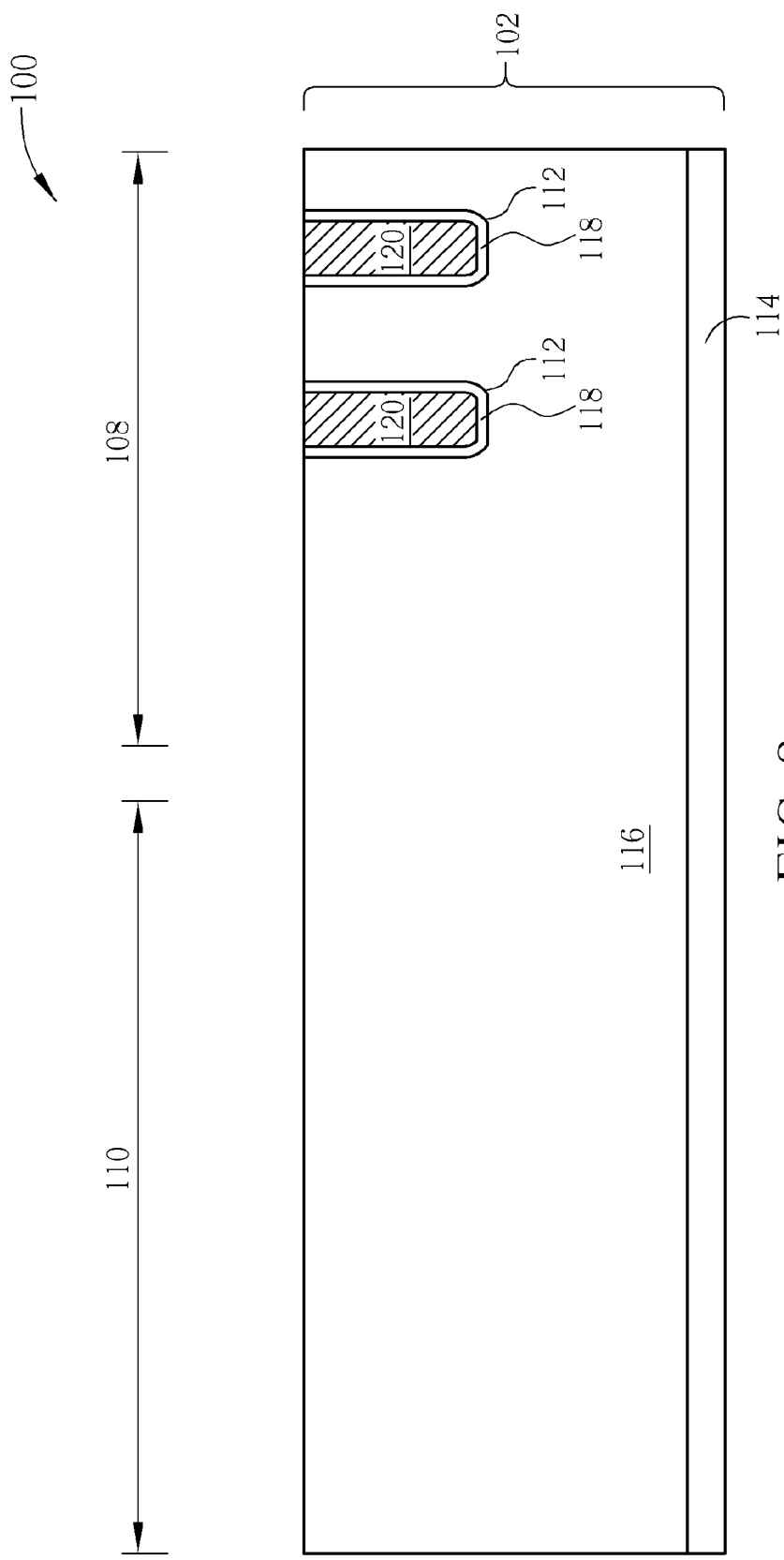

Next, at least one transistor device is formed in the N-semiconductor substrate 102 in the first pad region 108, and an N-heavily doped region is formed in the N-semiconductor substrate 102 in the second pad region 110. The steps of forming the transistor device and the N-heavily doped region are described in the following descriptions. As shown in FIG. 3, a deposition process is performed to form an insulating layer 118 to cover the upper surface 104 of the N-semiconductor substrate 102 as well as a sidewall and a bottom of each of the trenches 112. The insulating layer 118 in this embodiment could be a dielectric layer which is formed by a material such as borophosphosilicate glass (BPSG) or other silicon oxides, etc. The insulating layer 118 is not limited to be fabricated by the deposition process, and the present invention also can utilize a thermal oxidation process to form the insulating layer 118. After that, a deposition and an etch-back process are performed to form a gate conductive layer 120 on the insulating layer 118 in each of the trenches 112, and to remove the insulating layer 118 outside the trenches 112. The insulating layer 118 electrically insulates the N-semiconductor substrate 102 from the gate conductive layer 120, and thus a part of the insulating layer 118 can serve as a gate insulating layer of the transistor device, and also the gate conductive layer 120 can serve as the gate electrode of the transistor device. Additionally, the gate conductive layer 120 could be made with doped polysilicon material, but is not limited thereto.

Figure 4:
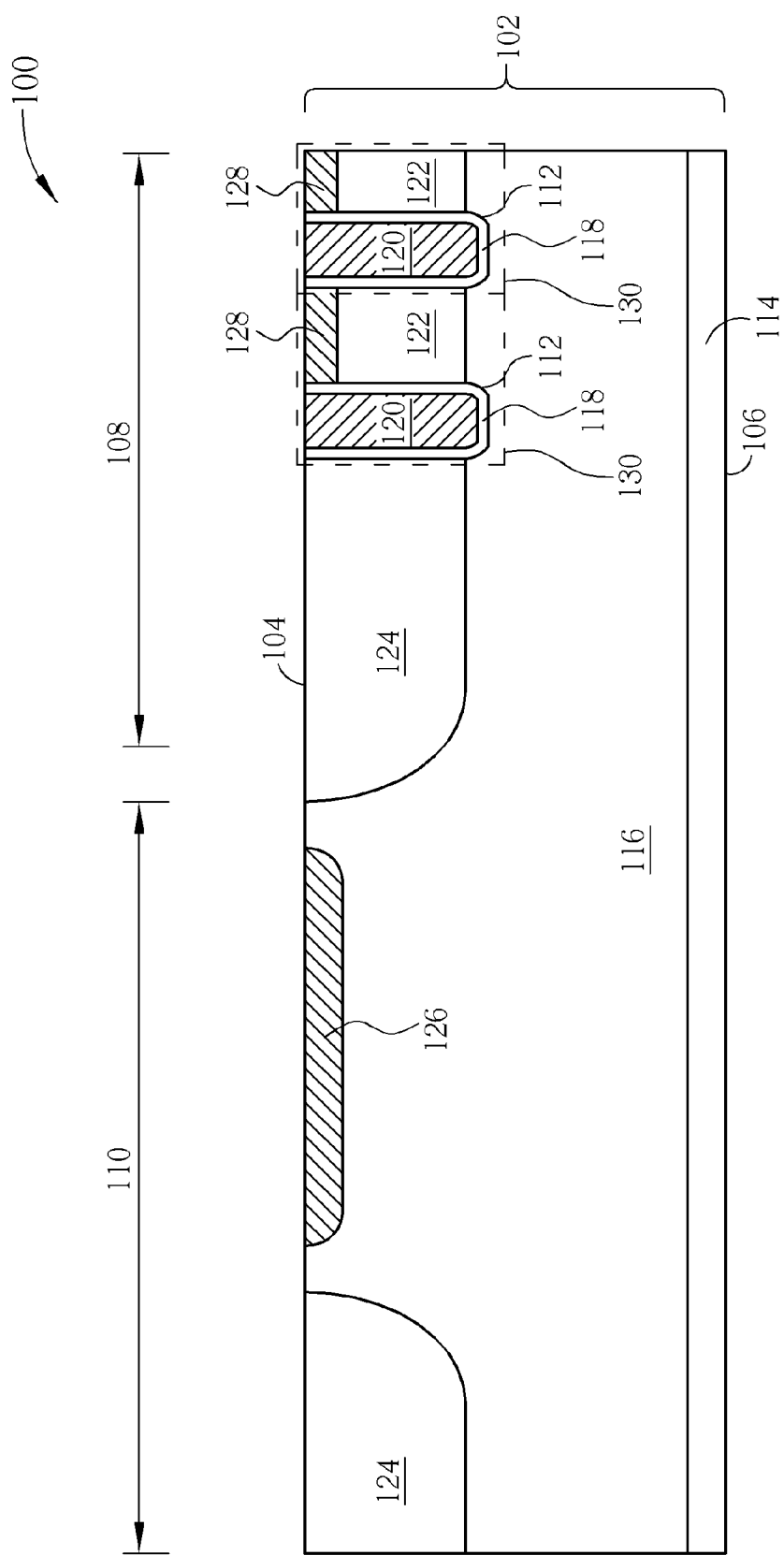

As shown in FIG. 4, then, a first mask (not shown) is formed on the N-semiconductor substrate 102. After that, an ion implantation process of a second conductive type is performed to implant ions with the second conductive type into the N-semiconductor substrate 102 at two sides of each of the trenches 112. The second conductive type in this embodiment is P type for example, so that the implanted ions of the P-type ion implantation process could be boron ions or boron fluoride ions, but not limited thereto. The first conductive type and the second conductive type are not limited to be N type and P type respectively, and vice versa. Then, the first mask is removed, and a drive-in process is performed to diffuse the P-type ions in the N-semiconductor substrate 102, so that a first P-doped body region 122 is formed in the N-semiconductor substrate 102 at a side of each of the trenches 112, and also two second P-doped body regions 124 are formed in the N-semiconductor substrate 102 in the first pad region 108 and the second pad region 110 respectively. Next, a second mask (not shown) is formed on the N-semiconductor substrate 102 to cover the second P-doped body regions 124, and then an N-type ion implantation process is performed on the N-semiconductor substrate 102 uncovered by the second mask to implant N-type ions, such as arsenic ions or phosphorous ions, into the N-semiconductor substrate 102 without doping P-type ions and into each of the first P-doped body regions 122. Next, another drive-in process is performed to diffuse the N-type ions in the N-semiconductor substrate 102, so that an N-heavily doped region 126 is formed in the N-semiconductor substrate 102 in the second pad region 110, and an N-doped source region 128 is formed on each of the first P-doped body regions 122. Each of the N-doped source regions 128 can serve as a source electrode of the transistor device, and the N-epitaxial layer 116 can serve as a drain electrode of the transistor device. Each of the first P-doped body regions 122 adjacent to the insulating layer 118 can serve as a channel region of the transistor device. It is appreciated that each of the gate conductive layers 120, the insulating layer 118, each of the first P-doped body regions 122, each of the N-doped source regions 128, and the N-epitaxial layer 116 constitute a transistor device 130, and the transistor device 130 is an NMOSFET device in this embodiment, but not limited thereto, the transistor device also could be other types of transistor devices in the present invention. In addition, the step of forming the first P-doped body regions 122 and the second P-doped body regions 124 and the step of forming the N-heavily doped region 126 and each of the N-doped source regions 128 are not limited to be performed separately, and the first P-doped body regions 122, the second P-doped body regions 124, the N-heavily doped region 126, and the N-doped source regions 128 can be formed simultaneously. That is, the N-type ion implantation process is directly performed after the P-type ion implantation process, and then a drive-in process is performed to form the first P-doped body regions 122, the second P-doped body regions 124, the N-heavily doped region 126, and the N-doped source regions 128 at the same time. Additionally, a doping dosage of the N-heavily doped region 126 is substantially between $10^{12}$ cm$^{-2}$ and $10^{16}$ cm$^{-2}$. Since the N-heavily doped region 126 having the doping dosage higher than that of the N-epitaxial layer 116 is disposed, the operation of the extra capacitor structure can be prevented from being affected by a depletion region formed between the N-epitaxial layer 116 adjacent to the second pad region 110 and the second P-doped body regions 124 extends into the second pad region 110.

Figure 5:
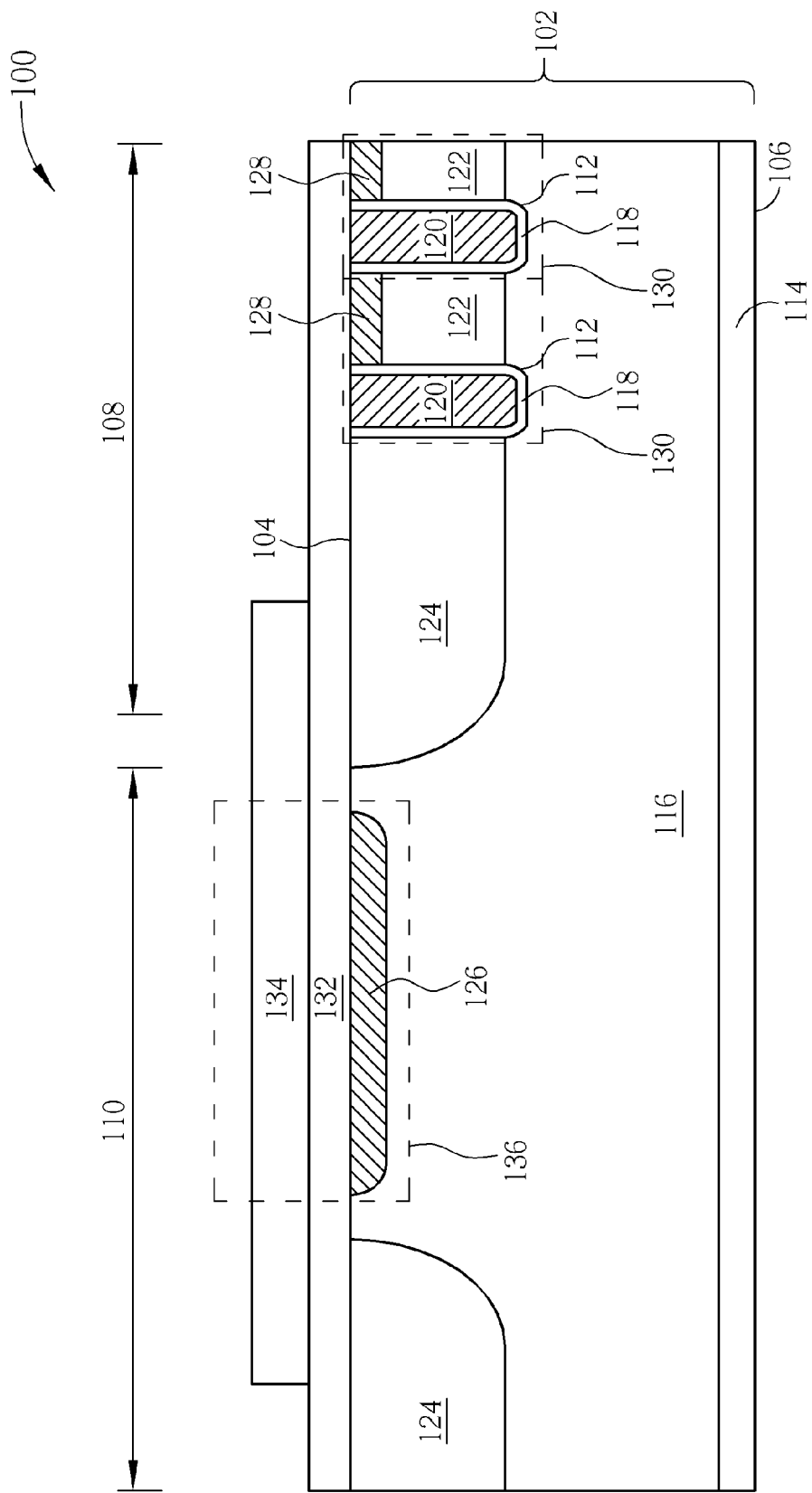

As shown in FIG. 5, then, a deposition process such as a chemical vapor deposition (CVD) process is performed to form a capacitor dielectric layer 132 to cover the upper surface 104 of the N-semiconductor substrate 102. Next, a deposition process and an etching and photolithography process are performed to form a conductive layer 134 on the capacitor dielectric layer 132, and the conductive layer 134 is extended from the second pad region 110 to a top of the second P-doped body region 124 in the first pad region 108, so that the N-heavily doped region 126, the capacitor dielectric layer 132, and the conductive layer 134 constitute a capacitor structure 136. The capacitor dielectric layer 132 can include oxide or nitride, such as silicon oxide or silicon nitride, and the conductive layer 134 can include polysilicon, but not limited thereto. In the present invention, the capacitor dielectric layer 132 is not limited to be formed by the deposition process, but also can be formed by a thermal oxidation process. Otherwise, a dry oxidation process or a wet oxidation process also can be performed to form silicon nitrides ($Si_3N_4$) or oxide layer/silicon nitride/oxide layer (ONO) structures. Since the capacitor dielectric layer 132 serves as a dielectric layer of the capacitor structure 136, a capacitance of the capacitor structure 136 is depended on a thickness and a dielectric constant of the capacitor dielectric layer 132, and the thickness and the dielectric constant of the capacitor dielectric layer 132 are based on a temperature and a time of the process of forming the capacitor dielectric layer 132. Therefore, the capacitance of the capacitor structure 136 is adjustable according to requirements by adjusting the material of the capacitor dielectric layer 132, temperature and time of the process, the thickness of the capacitor dielectric layer 132, and an overlapping area between the conductive layer 134 and the N-heavily doped region 126. For instance, voltage endurance of the capacitor dielectric layer 132 is 30V. A thickness of the capacitor dielectric layer 132 ranges between 200 Å and 3000 Å, and a thickness of the conductive layer 134 ranges between 1000 Å and 8000 Å. Moreover, the capacitor dielectric layer 132 is used to serve as the dielectric layer of the capacitor structure 136, and thus is not limited to be extended to a top of the transistor device 130. The capacitor dielectric layer 132 of the present invention can be aligned with the conductive layer 134 to electrically insulate the conductive layer 134 from the N-heavily doped region 126.

Figure 6:
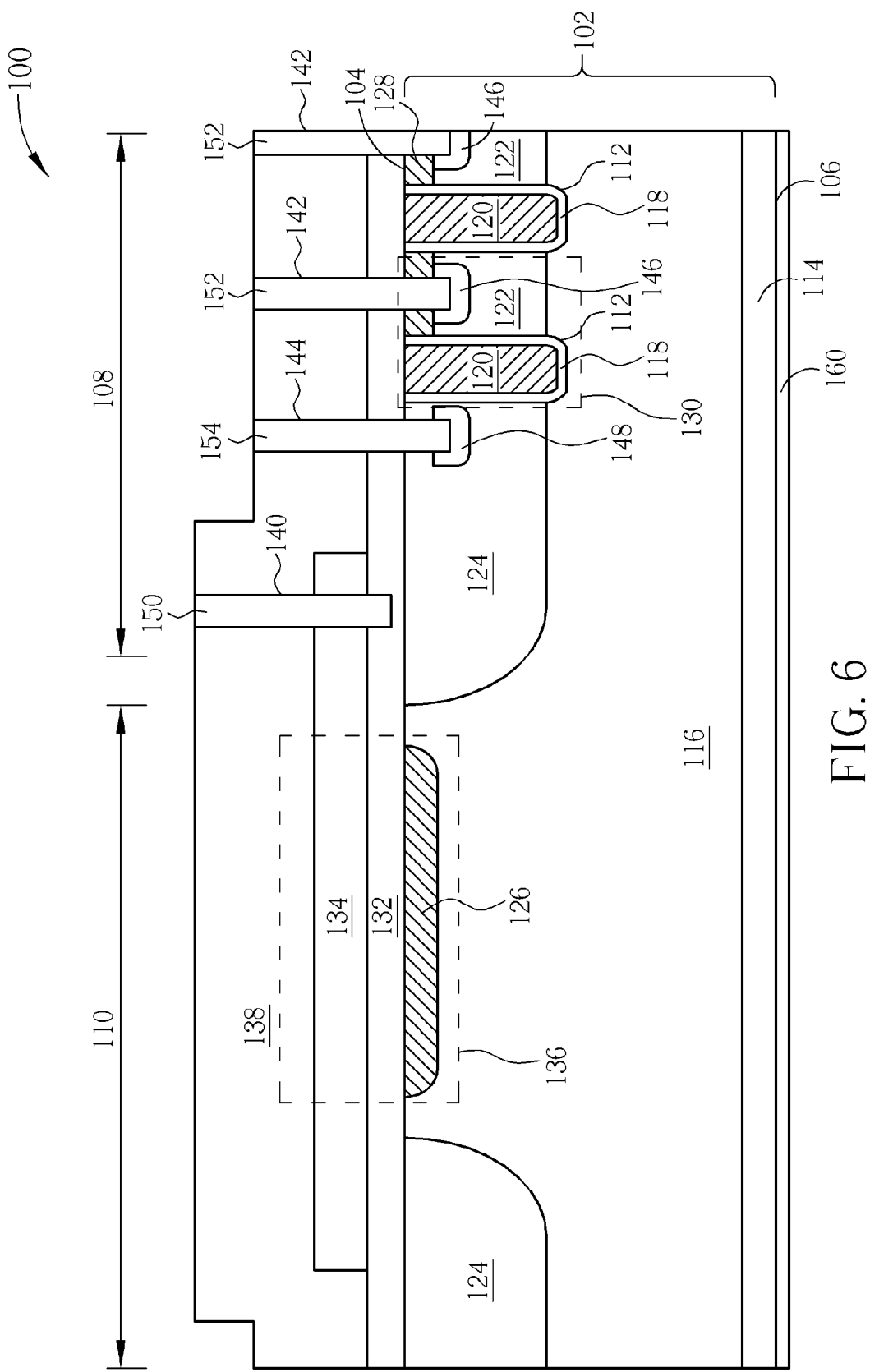

As shown in FIG. 6, then, a deposition process is performed to form an interlayer dielectric layer 138, which can be a dielectric layer formed by a material such as borophosphosilicate glass (BPSG) or other silicon oxides, etc., to completely cover the conductive layer 134 and the capacitor dielectric layer 132. Next, a photolithography and etching process is performed to form a first contact hole 140 in the interlayer dielectric layer 138 and the conductive layer 134 in the first pad region 108 and to form at least one second contact hole 142 and a third contact hole 144 in the interlayer dielectric layer 138 and the capacitor dielectric layer 132 in the first pad region 108. In this embodiment, the first contact hole 140, the second contact hole 142, and the third contact hole 144 have the same depths. The first contact hole 140 penetrates through the interlayer dielectric layer 138 and the conductive layer 134, and is also extended to the capacitor dielectric layer 132. The second contact hole 142 penetrates through the N-doped source regions 128 and exposes the first P-doped body regions 122, and the third contact hole 144 exposes the second P-doped body region 124. Then, a P-type ion implantation process and a drive-in process are performed to form a P-doped source contact region 146 in each of the exposed first P-doped body regions 122, and also to form a P-doped contact region 148 in the second P-doped body regions 122b, where the P-doped source contact region 146 is disposed under the N-doped source regions 128. Subsequently, a first contact plug 150 is filled in the first contact hole 140; a second contact plug 152 is filled in the second contact hole 142; and a third contact plug 154 is filled in the third contact hole 144. In the present invention, the first contact hole 140 is not limited to be formed simultaneously with the second contact hole 142 and third contact hole 144, and the first contact hole 140 can be formed before or after the second contact hole 142 and third contact hole 144. Also, the depth of the first contact hole 140 can be different from the depth of the second contact hole 142 and third contact hole 144. In other words, the first contact hole 140 can penetrate through the capacitor dielectric layer 132 and expose the second P-doped body region 124, or only expose the conductive layer 134.

Figure 7:
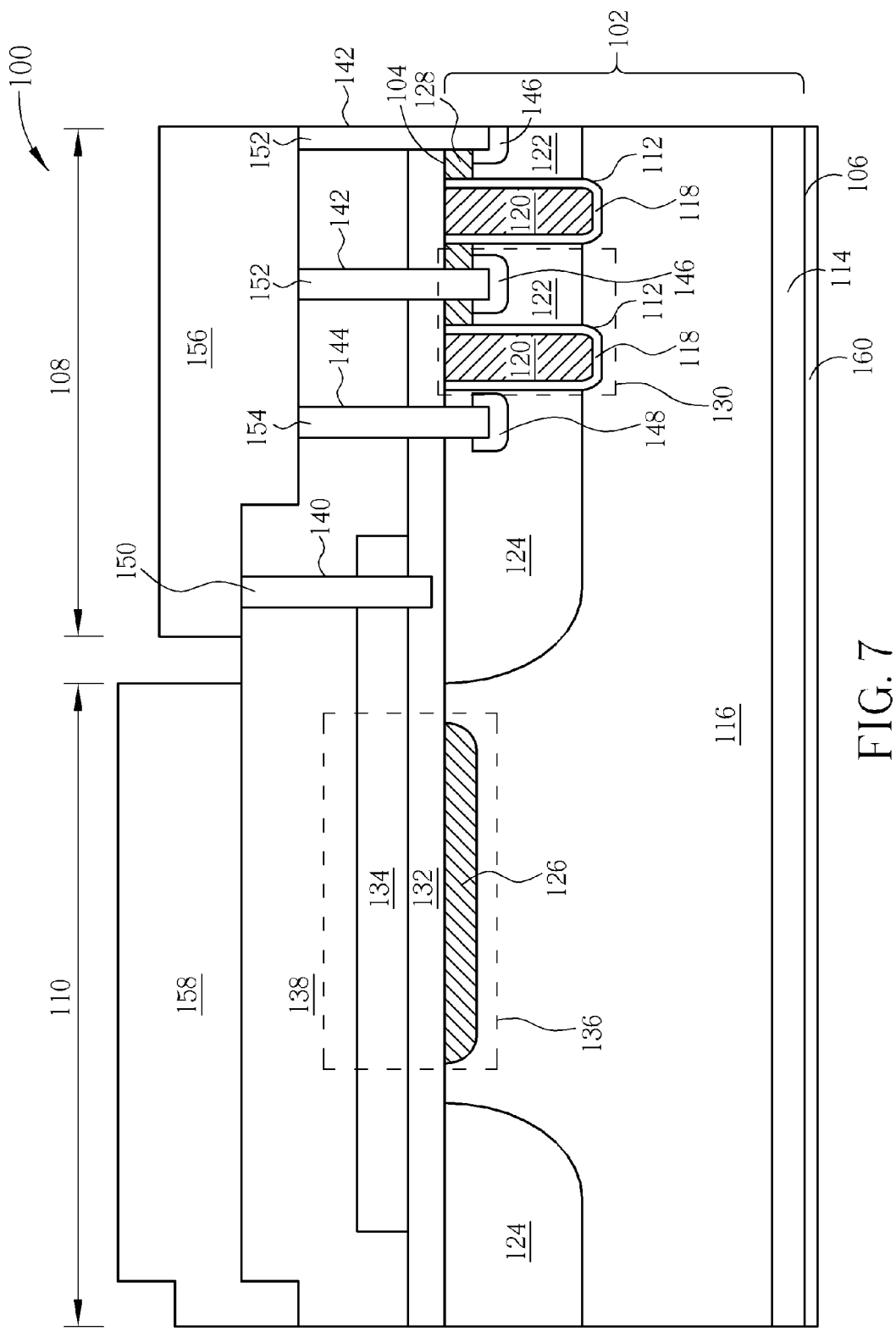

As shown in FIG. 7, finally, a source metal layer 156 is formed on the N-semiconductor substrate 102 in the first pad region 108, and a gate metal layer 158 is formed on the N-semiconductor substrate 102 in the second pad region 110. The source metal layer 156 and the gate metal layer 158 are not in contact with each other, and electrically insulated from each other. Then, a drain metal layer 160 is formed on the lower surface 106 of the N-semiconductor substrate 102, and the semiconductor device 100 having the extra the capacitor structure 136 is completed. In addition, the source metal layer 156, the gate metal layer 158, and the drain metal layer 160 could be made of aluminum copper (AlCu), aluminum silicon copper (AlSiCu), titanium wolfram (TiW), titanium nitride (TiN), wolfram (W), etc., but are not limited thereto. It is noted that the drain metal layer 160 is formed on the lower surface 106 of the N-semiconductor substrate 102, so the timing of forming the drain metal layer 160 is not limited thereto, and the drain metal layer 160 also can be formed before or after the process performed on the upper surface 104 of the N-semiconductor substrate 102.

Figure 8:
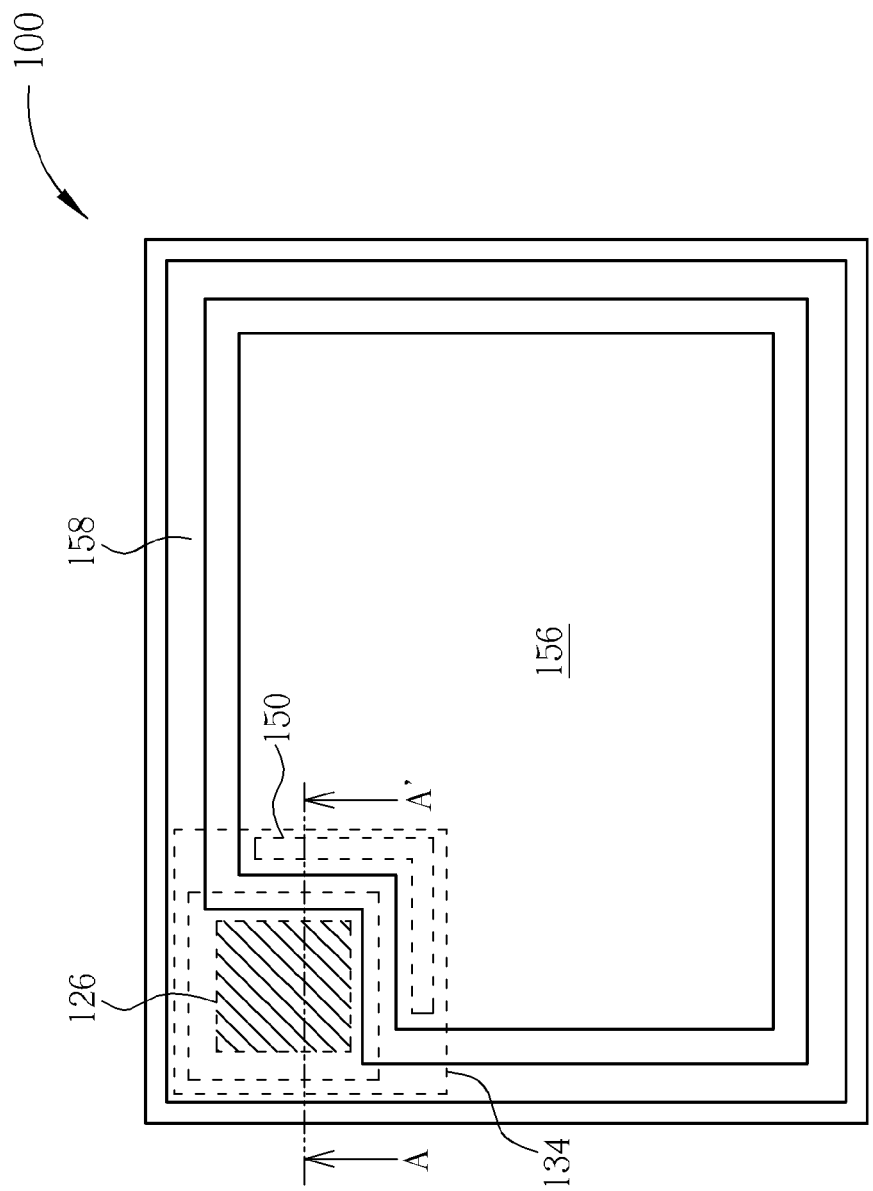
FIG. 8 is a schematic diagram illustrating a top view of the semiconductor device of the present invention.

To clearly describe the structure of the semiconductor device 100 according to this embodiment, please refer to FIG. 8 and FIG. 7. FIG. 8 is a schematic diagram illustrating a top view of the semiconductor device of the present invention, and FIG. 7 is a schematic diagram illustrating a cross-sectional view of the semiconductor device along a line AA' shown in FIG. 8 according to the first embodiment of the present invention. As shown in FIG. 7 and FIG. 8, the source metal layer 156 overlaps the interlayer dielectric layer 138 in the first pad region 108, and is in contact with the first contact plug 150, the second contact plug 152, and the third contact plug 154. Thus, the source metal layer 156 electrically connects to not only the conductive layer 134 but also the N-doped source regions 128. As a result, the source metal layer 156 is able to electrically connect an electrode of the capacitor structure 136 to the source electrode of the transistor device 130, and to serve as a source pad to electrically connect to exterior components. A range of the first pad region 108 can be determined according to a size of the source metal layer 156 serving as the source pad. Also, the transistor device 130 composed of each of the gate conductive layers 120, the insulating layer 118, each of the first P-doped body regions 122, each of the N-doped source regions 128, and the N-epitaxial layer 116 is disposed under the source metal layer 156. In other words, the transistor device 130 is disposed in the N-semiconductor substrate 102 between the source metal layer 156 and the drain metal layer 160. Moreover, the gate metal layer 158 overlaps the interlayer dielectric layer 138 in the second pad region 110, and is electrically connected to the gate conductive layers 120 so as to serve as a gate pad to electrically connect the gate conductive layers 120 to exterior components. A range of the second pad region 110 can be determined according to a size of the gate metal layer 158 serving as the gate pad. The capacitor structure 136 composed of the N-heavily doped region 126, the capacitor dielectric layer 132, and the conductive layer 134 is disposed under the gate metal layer 158. In other words, the he capacitor structure 136 is disposed between the gate metal layer 158 and the drain metal layer 160, and the interlayer dielectric layer 138 is disposed on the conductive layer 134 to electrically insulate the capacitor structure 136 from the gate metal layer 158. The conductive layer 134 extends to overlap the source metal layer 156 so that the first contact plug 150 can electrically connect the conductive layer 134 and the source metal layer 156. In addition, the N-heavily doped region 126 is disposed in the N-semiconductor substrate 102 under the gate metal layer 158, so that the capacitor structure 136 can be disposed under the gate metal layer 158. The capacitor structure 136 is in contact with the N-epitaxial layer 116 so that the other electrode of the capacitor structure 136 can be electrically connected to the drain electrode of the transistor device 130. As a result, the capacitor structure 136 electrically connected between the source electrode and the drain electrode of the transistor device 130 can serve as a snubber capacitor of the transistor device 130, and a capacitance of the snubber capacitor can be adjusted according to a required output capacitance of the semiconductor device 100. The drain metal layer 160 is in contact with the N-semiconductor substrate 102, so that the drain metal layer 160 electrically connecting to the transistor device 130 can serve as a drain pad.

As the above-mentioned description, the transistor device 130 and the extra capacitor structure 136 in this embodiment is integrated in the N-semiconductor substrate 102, so that an output capacitance of the semiconductor device 100 can be increased. Accordingly, a voltage spike can be reduced, and the power loss can be lowered when the transistor device 130 is switched off. It is noted that the extra capacitor structure 136 in this embodiment is disposed under the gate metal layer 158 without occupying a disposition space for the transistor device 130 under the source metal layer 156, so that the size of the transistor device 130 can be prevented from being limited due to the extra capacitor structure 136 being disposed under the source metal layer 156.

Figure 9:
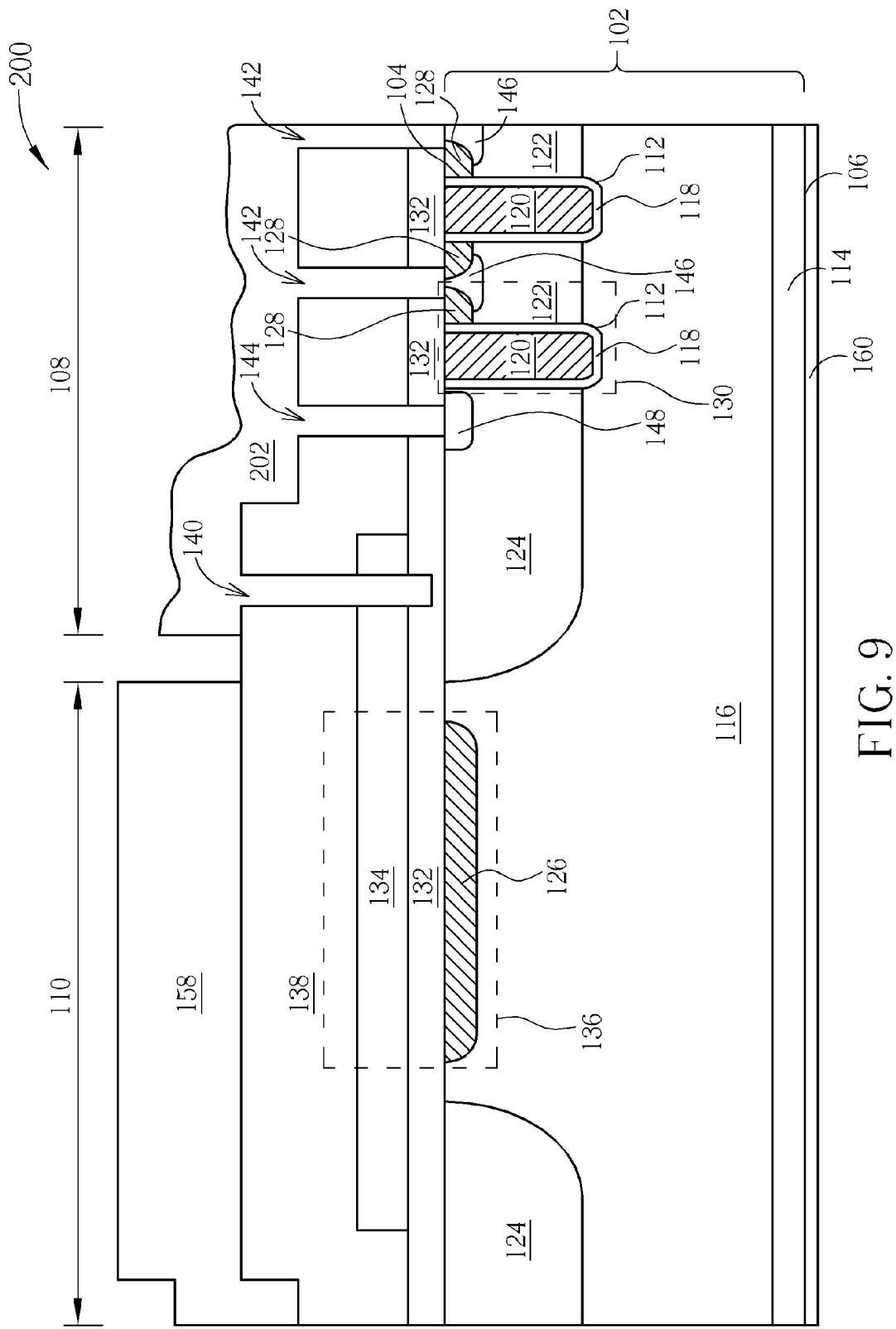
FIG. 9 is a schematic diagram illustrating a cross-sectional view of the semiconductor device along a line AA' shown in FIG. 8 according to a second embodiment of the present invention.

Furthermore, the structure of the transistor device is not limited to the aforementioned. Please refer to FIG. 9, which schematically illustrates a cross-sectional view of a semiconductor device along a line AA' shown in FIG. 8 according to a second embodiment of the present invention. In order to clearly compare differences between the first embodiment and the second embodiment, the same components are denoted by the same numerals, and the same parts are not redundantly described. As shown in FIG. 9, the semiconductor device 200 in the second embodiment does not have the first contact plug, the second contact plug, and the third contact plug, and the source metal layer 202 is directly filled in the first contact hole 140, the second contact hole 142, and the third contact hole 144 in the interlayer dielectric layer 138 to be in contact with the N-doped source regions 128, the P-doped source contact region 146, P-doped contact region 148, and the conductive layer 134 and to electrically connect a side of the capacitor structure 136 to the source electrode of the transistor device 130.

To sum up, the manufacturing method of the semiconductor device is to fabricate the transistor device and the extra capacitor structure at the same time, so that the transistor device and the extra capacitor structure can be fabricated in a semiconductor device, and the extra capacitor structure of the semiconductor device and the transistor device of the present invention can be electrically connected to the same drain metal layer and the source metal layer. Thus, the output capacitance of the semiconductor device can be increased. Accordingly, the voltage spike can be decreased, and the power loss can be lowered when the semiconductor device is switched off. Moreover, the output capacitance of the semiconductor device can be changed by adjusting the capacitance of the extra capacitor structure. In addition, the extra capacitor structure of the semiconductor device is composed of the N-heavily doped region, the capacitor dielectric layer, and the conductive layer, and extra capacitor structure does not occupy a disposition space for the transistor device under the source metal layer, so that the size of the transistor device can be prevented from being limited due to the extra capacitor structure being disposed under the source metal layer.

Those skilled in the art will readily observe that numerous modifications and alterations of the device and method may be made while retaining the teachings of the invention.

What is claimed is:

1. A semiconductor device having an extra capacitor structure, comprising:
   a semiconductor substrate, having an upper surface and a lower surface, wherein the semiconductor substrate has a first conductive type;
   a source metal layer, disposed on the upper surface of the semiconductor substrate;
   a gate metal layer, disposed on the upper surface of the semiconductor substrate;

a drain metal layer, disposed on the lower surface of the semiconductor substrate;

at least a transistor device, disposed in the semiconductor substrate between the source metal layer and the drain metal layer, and the transistor device comprising a source electrode, a gate electrode, and a drain electrode, wherein the source electrode is electrically connected to the source metal layer; the gate electrode is electrically connected to the gate metal layer; and the drain electrode is electrically connected to the drain metal layer;

a heavily doped region, disposed in the semiconductor substrate between the gate metal layer and the drain metal layer, wherein the heavily doped region has a first conductive type;

a capacitor dielectric layer, disposed on the semiconductor substrate and being in contact with the heavily doped region;

a conductive layer, disposed between the capacitor dielectric layer and the gate metal layer and electrically connected to the source metal layer, wherein the heavily doped region, the capacitor dielectric layer, and the conductive layer constitute a capacitor structure; and an interlayer dielectric layer, disposed between the source metal layer and the semiconductor substrate and between the gate metal layer and the conductive layer.

2. The semiconductor device according to claim 1, wherein the conductive layer is extended to overlap the source metal layer.

3. The semiconductor device according to claim 2, further comprises a first contact plug, penetrating through the interlayer dielectric layer between the source metal layer and the conductive layer to electrically connect the source metal layer and the conductive layer.

4. The semiconductor device according to claim 3, wherein the first contact plug penetrates through the capacitor dielectric layer.

5. The semiconductor device according to claim 1, wherein a dielectric constant of the capacitor dielectric layer is larger than a dielectric constant of the interlayer dielectric layer.

6. The semiconductor device according to claim 1, wherein a thickness of the capacitor dielectric layer is smaller than a thickness of the interlayer dielectric layer.

7. The semiconductor device according to claim 1, wherein the upper surface of the semiconductor substrate comprises at least a trench, and the transistor device comprises:

an insulating layer, disposed on a sidewall of the trench;

a gate conductive layer, disposed in the trench and serving as the gate electrode of the transistor device;

a doped body region, disposed at a side of the trench, wherein the doped body region has a second conductive type; and a doped source region, disposed in the doped body region and serving as the source electrode of the transistor device, wherein the doped source region has the first conductive type.

8. The semiconductor device according to claim 7, further comprises:

a doped source contact region, disposed in the doped body region under the doped source region, wherein the doped source contact region has the second conductive type; and at least a second contact plug, electrically connecting the doped source region and the doped source contact region to the source metal layer.

9. The semiconductor device according to claim 7, wherein the source metal layer is in contact with the doped source region.

10. The semiconductor device according to claim 7, wherein the first conductive type is N type, and the second conductive type is P type.

11. The semiconductor substrate according to claim 1, wherein the semiconductor substrate comprises a substrate and an epitaxial layer disposed on the substrate, and a doping dosage of the heavily doped region is higher than a doping dosage of the epitaxial layer, wherein the epitaxial layer serves as the drain electrode of the transistor device.

* * * * *

UNITED STATES PATENT AND TRADEMARK OFFICE
CERTIFICATE OF CORRECTION

| | | |
|---|---|---|
| PATENT NO. | : 8,258,555 B2 | |
| APPLICATION NO. | : 13/008908 | |
| DATED | : September 4, 2012 | |
| INVENTOR(S) | : Wei-Chieh Lin | |

It is certified that error appears in the above-identified patent and that said Letters Patent is hereby corrected as shown below:

On the title page, item (30), correct the filing date of the Foreign Application Priority Data from "August 20, 2010" to --August 30, 2010--.

Signed and Sealed this
Twenty-seventh Day of November, 2012

David J. Kappos
*Director of the United States Patent and Trademark Office*